United States Patent [19]

Konishi et al.

[11] Patent Number: 5,184,321
[45] Date of Patent: Feb. 2, 1993

[54] SEMICONDUCTOR MEMORY DEVICE COMPRISING A PLURALITY OF MEMORY ARRAYS WITH IMPROVED PERIPHERAL CIRCUIT LOCATION AND INTERCONNECTION ARRANGEMENT

[75] Inventors: Yasuhiro Konishi; Masaki Kumanoya; Katsumi Dosaka; Takahiro Komatsu; Yoshinori Inoue, all of Hyogo, Japan

[73] Assignee: Mitsubishi Denki Kabushiki Kaisha, Tokyo, Japan

[21] Appl. No.: 821,875

[22] Filed: Jan. 16, 1992

Related U.S. Application Data

[63] Continuation of Ser. No. 437,874, Nov. 17, 1989, abandoned.

[30] Foreign Application Priority Data

Dec. 6, 1988 [JP] Japan .................. 63-309242

[51] Int. Cl.$^5$ .................. G11C 5/06
[52] U.S. Cl. .................. 365/51; 365/63; 257/920
[58] Field of Search .................. 365/51, 63, 189.08, 365/230.03, 230.06; 257/920

[56] References Cited

U.S. PATENT DOCUMENTS

| | | |
|---|---|---|
| 4,658,377 | 4/1987 | McElroy . |
| 4,679,171 | 7/1987 | Logwood et al. . |
| 4,779,227 | 10/1988 | Kurafuji et al. .................. 365/51 |
| 4,849,943 | 7/1989 | Pfennings .................. 365/51 |
| 5,007,025 | 4/1991 | Hwang et al. .................. 365/226 |
| 5,040,144 | 8/1991 | Pelley et al. .................. 365/226 |

FOREIGN PATENT DOCUMENTS

| | | |
|---|---|---|
| 62-180594 | 8/1987 | Japan . |
| 0188363 | 8/1987 | Japan .................. 357/45 |
| 63-39196 | 2/1988 | Japan . |
| 0291460 | 11/1988 | Japan .................. 357/45 |
| 0010870 | 1/1990 | Japan .................. 357/45 |

OTHER PUBLICATIONS

K. Kimura et al, "Power Reduction Techniques in Megabit DRAM's", *IEEE Journal of Solid-State Circuits*, vol. SC-21, vol. SC-21, (Jun. 1986), pp. 381-387.

*Primary Examiner*—Joseph L. Dixon
*Assistant Examiner*—Jack A. Lane
*Attorney, Agent, or Firm*—Lowe, Price, LeBlanc & Becker

[57] ABSTRACT

A plurality of memory arrays (10a, 10b) are formed on a semiconductor chip (CH). A peripheral circuit (60) is arranged in the central portion of the plurality of memory arrays (10a, 10b). A plurality of pads (PD;p1~p18) are formed on both ends of the semiconductor chip (CH). The plurality of memory arrays (10a, 10b) are formed of predetermined layers (101~109). A plurality of interconnections (L) to be connected between the plurality of pads (PD;p1~p18) and the peripheral circuit (60) are provided to cross the plurality of memory arrays. The plurality of interconnections (L) are formed of layers (112;113) other than the predetermined ones.

26 Claims, 14 Drawing Sheets

SEMICONDUCTOR MEMORY DEVICE COMPRISING A PLURALITY OF MEMORY ARRAYS WITH IMPROVED PERIPHERAL CIRCUIT LOCATION AND INTERCONNECTION ARRANGEMENT

CROSS-REFERENCE OF THE INVENTION

The present application is related to copending application Ser. No. 07/437,867 now abandoned to Yasuhiro Konishi, Masaki Kumanoya, Katsumi Dosaka, Takahiro Komatsu and Yoshinori Inoue, filed currently herewith and commonly assigned with the present application.

This application is a continuation application of application Ser. No. 07/437,874, filed Nov. 17, 1989 now abandoned.

BACKGROUND OF THE INVENTION

1. Field of the Invention

The present invention relates generally to semiconductor memory devices, and more particularly, to a semiconductor memory device comprising a plurality of memory arrays.

2. Description of the Background Art

FIG. 7 is a circuit diagram showing a structure of a main part of a general dynamic random access memory (referred to as DRAM hereinafter).

In FIG. 7, in a memory array 10, a plurality of word lines WL0 to WLi and a plurality of bit line pairs B0 and $\overline{B0}$ to Bj and $\overline{Bj}$ are arranged intersecting with each other, memory cells MC being provided at intersections thereof. More specifically, a plurality of memory cells MC are arranged in a matrix. Each of the bit line pairs B0 and $\overline{B0}$ to Bj and $\overline{Bj}$ is connected to an input/output line pair I/O and $\overline{I/O}$ through an I/O gate comprising transistors Q1 and Q2. In addition, a sense amplifier SA is connected to each of the bit line pairs B0 and $\overline{B0}$ to Bj and $\overline{Bj}$. A plurality of sense amplifiers SA constitute a sense amplifier portion 30, and a plurality of I/O gates constitute an I/O gate portion 40.

An X decoder 20 is responsive to an externally applied X address signal for selecting one of the word lines WL0 to WLi to raise a potential on the word line. Consequently, information charges stored in a plurality of memory cells MC connected to the selected word line are read out to corresponding bit lines as data. As a result, there occurs a very small potential difference between two bit lines constituting each of the bit line pairs. This very small potential difference is amplified by a corresponding sense amplifier SA. On the other hand, a Y decoder 50 is responsive to an externally applied Y address signal for selecting one bit line pair to apply a column selecting signal to a corresponding I/O gate through a column selecting line CL. Consequently, the selected bit line pair is connected to the input/output line pair I/O and $\overline{I/O}$. As a result, data is read out to the input/output line pair I/O and $\overline{I/O}$. The data is outputted to an external output pin through a circuit of the output system (not shown).

FIG. 8A is a cross-sectional view showing a memory cell in the most general DRAM. n+ diffusion regions 102 and 105 are formed on a silicon substrate 101. Storage capacitance is formed of the n+ diffusion region 102, a first polysilicon (polycrystalline silicon) layer 103 and a thin oxide film 104 therebetween. In addition, an access transistor is formed of the n+ diffusion region 102, the n+ diffusion region 105 and a second polysilicon layer 106 provided in the upper portion of a region therebetween through an insulating film. Furthermore, a contact is formed between a first aluminum layer 107 and the n+ diffusion region 105. The first polysilicon layer 103 is used as a cell plate electrode, the second polysilicon layer 106 is used as a word line, and the first aluminum layer 107 is used as a bit line. The memory cell thus formed is isolated from another memory cell by a silicon oxide film 108.

FIG. 8C shows an equivalent circuit of the memory cell. A bit line BL and a word line WL are respectively formed of the first aluminum layer 107 and the second polysilicon layer 106 shown in FIG. 8A. In addition, a storage node N is formed of the n+ diffusion region 102, and a cell plate electrode PL is formed of the first polysilicon layer 103.

A polysilicon layer and an aluminum layer have been conventionally used as interconnection materials of the semiconductor memory device because they are easily formed. Since the melting point of aluminum is lower than that of polysilicon, the polysilicon layer is used as the word line WL.

FIG. 9 is a block diagram showing the entire layout of the DRAM having a structure shown in FIG. 7.

This DRAM comprises eight memory arrays aligned. The eight memory arrays are divided into four blocks, each of the blocks comprising memory arrays 10a and 10b. A sense amplifier portion 30 and an I/O gate portion 40 corresponding to the memory array 10a, a sense amplifier portion 30 and an I/O gate portion 40 corresponding to the memory array 10b, and a Y decoder 50 which is common thereto are arranged between the memory arrays 10a and 10b. In addition, each of the memory arrays 10a and 10b is provided with an X decoder 20. Furthermore, a peripheral circuit 60 is provided in the side portion of the aligned eight memory arrays. The peripheral circuit 60 comprises a circuit for generating a signal for driving the memory arrays 10a and 10b, the X decoders 20, the Y decoders 50, the sense amplifier portions 30 and the like, an address buffer for applying an externally applied address signal to the X decoders 20 and the Y decoders 50, and a circuit for inputting or outputting data to or from the I/O gate portions 40.

The Japanese Laying-Open Gazette Publication No. 180594/1987 discloses a semiconductor memory device comprising two memory cell array blocks, a peripheral circuit for normal access and a peripheral circuit for refreshing which are arranged therebetween. In this semiconductor memory device, either one of the two memory cell array blocks is selectively driven. This semiconductor memory device has the advantage that interconnections connected between the peripheral circuit for normal access and the peripheral circuit for refreshing and the two memory cell array blocks may be short. However, the semiconductor memory device has the disadvantage that there is a limit in increasing capacity because only two memory cell array blocks are driven by the peripheral circuit for normal access and the peripheral circuit for refreshing.

For example, in the case of a 1 M-bit DRAM, a single memory array comprises 256 word lines and 512 bit line pairs. Thus, each of the word lines intersects with the 1024 bit lines, so that the length thereof is substantially increased. Therefore, if and when a word line is formed of a polysilicon layer as described above, the resistance value of the word line becomes high. As a result, there is considerable delay time from the time when an output of the X decoder 20 rises to the time when a gate potential of an access transistor of a memory cell in a position farthest away from the X decoder 20 rises. This delay time is not preferable because it leads to the delay of access time in the DRAM, thereby to degrade the performance of the DRAM.

In order to solve the delay in each of the word lines, a shunt interconnection for a word line as described below is used. FIGS. 10A and 10B are diagrams for explaining this shunt interconnection for a word line. An aluminum layer AL is provided in the upper portion of a word line WL formed of a polysilicon layer. Contact portions CN are formed between the word line WL and the aluminum layer AL at three points obtained by dividing the word line WL into four equal parts and two points on both sides thereof. Sheet resistance (resistance per unit width) of aluminum can be ignored because it is lower than that of polysilicon by three orders of magnitude. It is assumed that the resistance value of the word line WL from an X decoder 20 to a memory cell in a position farthest away therefrom is 4R0 when there is no shunt interconnection. As shown in FIG. 10A, when there is a shunt interconnection, the resistance value from the X decoder 20 to a memory cell in a middle position between the adjacent contact portions CN is highest. However, the resistance value in this case becomes ($\frac{1}{2}$) R0, which is one-eighth of the resistance value obtained when there is no shunt interconnection.

If and when a shunt interconnection is provided for a word line as described above, the spacing must be provided between memory cells so as to provide contact portions between the word line and an aluminum layer. Therefore, as shown in FIG. 10B, a memory array 10 is divided into four groups 11 of memory cells, the spacing 12 for connections CN of a shunt portion being provided between the adjacent groups 11 of memory cells.

FIG. 8B is a cross-sectional view showing a memory cell in a case in which a shunt interconnection for a word line is provided. In the memory cell shown in FIG. 8B, a bit line is formed of a third polysilicon layer 109 instead of the first aluminum layer 107. In addition, a first aluminum layer 110 is formed above the second polysilicon layer 106 to be a word line in parallel with the second polysilicon layer 106. Contact portions are formed for each constant distance, as shown in FIG. 10A, between the first aluminum layer 110 and the second polysilicon layer 106. Consequently, the resistance value of the word line formed of the second polysilicon layer 106 is decreased, so that delay time in changing a potential transmitted through the word line is decreased.

FIG. 11 is a circuit diagram showing a structure of a main part of another DRAM. In this DRAM, a Y decoder 50 is common to a plurality of memory arrays. In FIG. 11, the Y decoder 50 is common to memory arrays 10a and 10b. In this case, a column selecting line CL of the Y decoder 50 is formed of an aluminum layer. This column selecting line CL is provided so as to cross the memory arrays 10a and 10b. Since an ordinary column selecting line is formed of the same interconnection layer as that forming any one of a bit line, a word line and a shunt interconnection for the word line, the column selecting line can not cross memory arrays. Therefore, when a first aluminum layer is used in a memory cell as shown in FIGS. 8 and 8B, the column selecting line is formed of a second aluminum layer.

The foregoing is also described in FIG. 8 of IEEE Journal of Solid-State Circuits, Vol. SC-21, No. 3, June 1986.

The advantage of the structure shown in FIG. 11 is that separate Y decoders are not required for each memory array since a single Y decoder 50 is provided in an end of a group of memory arrays and only column selecting lines are extended to a plurality of memory arrays.

Furthermore, in the DRAM shown in FIG. 11, a shared sense amplifier is used. In the shared sense amplifier, two bit line pairs are driven by a single sense amplifier SA, as shown in FIG. 11. More specifically, the sense amplifier SA is connected to bit line pairs BL1 and BL2 in the memory array 10a through transistors Q3 and Q4 and connected to bit line pairs BL3 and BL4 in the memory array 10b through transistors Q5 and Q6. The plurality of transistors Q3 and Q4 constitute a first array selecting switch 70a, and the plurality of transistors Q5 and Q6 constitute a second array selecting switch 70b.

Referring to a timing chart of FIG. 12, description is made of an operation of the shared sense amplifier shown in FIG. 11.

In FIG. 12, when an externally applied row address strobe signal $\overline{RAS}$ is at the "H" level, i.e., in the inactive state, a first switch activating signal $\phi_{S1}$ and a second switch activating signal $\phi_{S2}$ are both at the "H" level. Thus, the transistors Q3 to Q6 are all in the on state, so that the bit line pairs BL1 and BL2 and the bit line pairs BL3 and BL4 are connected to the sense amplifier SA.

When the row address strobe signal $\overline{RAS}$ falls to the "L" level so that the DRAM is rendered active, either one of the memory arrays 10a and 10b is selected in response to an externally applied X address signal. For example, when the memory array 10a is selected, the first switch activating signal $\phi_{S1}$ remains at the "H" level while the second switch activating signal $\phi_{S2}$ falls to the "L" level. Consequently, the transistors Q5 and Q6 are turned off, so that the bit line pair BL3 and BL4 is electrically disconnected from the sense amplifier SA. In this case, all bit line pairs in the memory array 10b are electrically disconnected from sense amplifiers.

Then, a potential on a single word line WL in the memory array 10a rises in response to the X address signal, so that information charges stored in a plurality of memory cells connected to the word line are respectively read out to corresponding bit lines. On this occasion, a potential on a word line in the memory array 10b does not rise. A sense amplifier activating signal $\phi_{SA}$ rises to the "H" level so that the sense amplifier SA is activated, whereby a potential difference between two bit lines constituting each bit line pair is amplified. In FIG. 12, potentials on bit lines constituting each bit line pair are denoted by BL and $\overline{BL}$. Thereafter, a single column selecting line CL is selected in response to an externally applied Y address signal, so that a column selecting signal $\phi_{CS}$ applied to the column selecting line CL rises to the "H" level. As a result, a set of transistors Q1 and Q2 are turned on, so that the corresponding bit line pair BL1 and BL2 is connected to an input/output line pair I/O and $\overline{I/O}$.

Meanwhile, the above described shared sense amplifier can be applied to a DRAM having a structure in which column selecting lines do not cross memory arrays, as shown in FIG. 13. In this case, in order to connect a bit line pair BL1 and BL2 in a memory array 10a to an input/output line pair I/O and I/O as shown in FIG. 13, it is necessary to connect the bit line pair BL1 and BL2 to the input/output line pair I/O and I/O through a bit line pair BL3 and BL4 by activating a sense amplifier SA and then, turning transistors Q5 and Q6 on again. On this occasion, since bit lines in a memory array 10b is charged and discharged, the DRAM shown in FIG. 13 is less advantageous than the DRAM shown in FIG. 11 in terms of power consumption and access time.

FIG. 14 is a block diagram showing the entire layout of the DRAM having the structure shown in FIG. 11.

In FIG. 14, eight memory arrays are aligned, a single Y decoder 50 being provided in an end thereof. The eight memory arrays are divided into four blocks, each of the blocks comprising memory arrays 10a and 10b. A first array selecting switch 70a for selecting the memory array 10a, a second array selecting switch 70b for selecting the memory array 10b, a sense amplifier portion 30 and an I/O gate portion 40 which are common thereto are provided between the memory arrays 10a and 10b within each of the four blocks. Use of two array selecting switches 70a and 70b permits sense amplifier 30 to be shared between memory arrays 10a and 10b, permitting reduction of chip area. In addition, an X decoder 20 is provided for each of the memory arrays. Furthermore, a peripheral circuit 60 is provided in the side portion of the aligned eight memory arrays.

In this DRAM, columns in the eight memory arrays are selected by the single Y decoder 50. Therefore, column selecting lines are provided from the Y decoder 50 so as to cross the plurality of memory arrays. In FIG. 14, only a single typical column selecting line CL is illustrated.

As shown in FIGS. 9 and 14, the eight memory arrays are aligned to put the DRAM in a rectangular package. The DRAM shown in FIG. 14 using a shared sense amplifier has the advantage that the DRAM shown in FIG. 14 becomes shorter in a direction of a long side than the DRAM shown in FIG. 9 because only a single Y decoder is required.

Similarly, a semiconductor memory device in which column selecting lines from a Y decoder are provided to cross a plurality of memory array blocks is also disclosed in Japanese Patent Laying-Open Gazette No. 39196/1988.

Description is now made of the relation between a package and pads on a chip.

FIG. 15 is a diagram showing a pin arrangement of a dual inline package (DIP) of a 1 M-bit DRAM, and FIG. 16 is a diagram showing one example of a chip mounted on the package. As shown in FIG. 15, pins p1 to p18 are provided along long sides on both sides of a rectangular package. Pads p1 to p18 are arranged in the vicinity of short sides of the chip CH, as shown in FIG. 16, by restrictions caused by the shape of such a package. Peripheral circuits 60 are arranged on both sides of a circuit portion 80 comprising memory arrays, decoders and sense amplifiers. Interconnections are provided for the peripheral circuit 60 from the pads P1 to P18. In general, the width of each of the interconnections formed of aluminum is approximately 2 μm. However, since a large current flows in a power supply line (Vcc) and a ground line (Vss), the widths thereof must be approximately 100 μm.

As shown in FIG. 16, the conventional DRAM described above has the disadvantage that a plurality of interconnections such as an external signal line, a power supply line, and a ground line which are to be provided between pads on a chip CH and peripheral circuits are arranged in the both sides area of a circuit portion comprising memory arrays, decoders and sense amplifiers so that the short sides of the chip CH become longer, and thus the chip area is increased.

SUMMARY OF THE INVENTION

An object of the present invention is to avoid increase in chip area due to the interconnections such as an external signal line, a power supply line and a ground line in a semiconductor memory device.

Another object of the present invention is to provide a semiconductor memory device capable of performing a high speed operation and having a small chip area.

Still another object of the present invention is to provide a large capacity semiconductor memory device with a small chip area, in which transmission of signals is not delayed.

Still another object of the present invention is to form interconnections such as an external signal line, a power supply line and a ground line in a semiconductor memory device comprising a plurality of memory arrays, without increasing the chip area.

The semiconductor memory device according to the present invention comprises a semiconductor chip, first and second memory means, driving circuit or memory driving means, one or more pads and interconnections. The first and second memory means are provided on the semiconductor chip, and formed of predetermined layers. The driving circuit or memory driving means is provided on the semiconductor chip, and drives the first and second memory means. The pads are provided on the semiconductor chip, and receive externally applied signals and predetermined potentials. Interconnections are formed of a separate layer from the above described one, and connected between the pads and the circuit means.

Additionally, the first and second memory means are provided on one and the other sides of the driving circuit means, respectively. The interconnections are provided to cross one of the first and second memory means, whereby no additional chip area is required to form the interconnections.

In the semiconductor memory device according to the present invention, the interconnections connected between the pads and the circuit means are provided to cross the first and second memory means. Therefore, the area on a chip required for the interconnections, is reduced. As a result, it becomes possible to reduce the semiconductor chip area.

Furthermore, the length of the interconnections connected between the pads and the circuit means is shortened so that the delay of signals in the interconnections is reduced.

DESCRIPTION OF THE PREFERRED EMBODIMENTS

Figure 1:
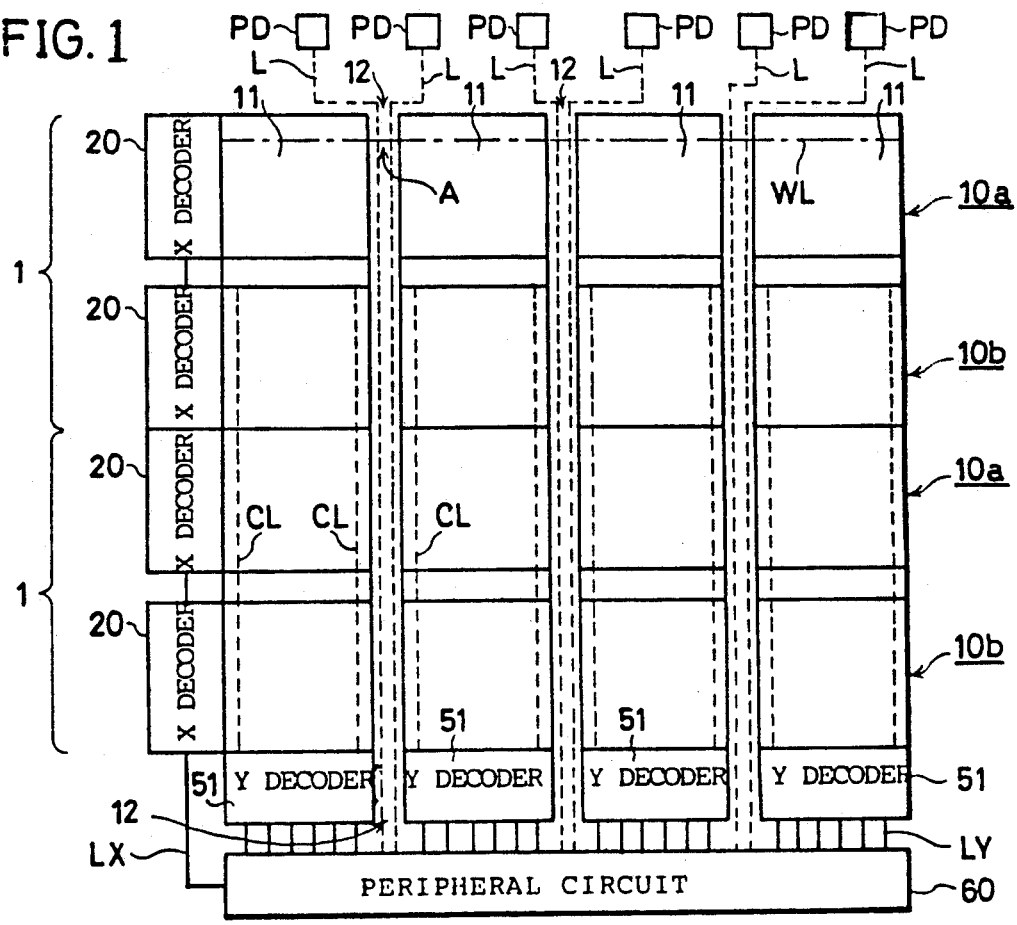
FIG. 1 is a block diagram showing a structure of the main part of a DRAM according to an embodiment of the present invention.

Referring now to the drawings, embodiments of the present invention will be described in detail.

Figure 2:
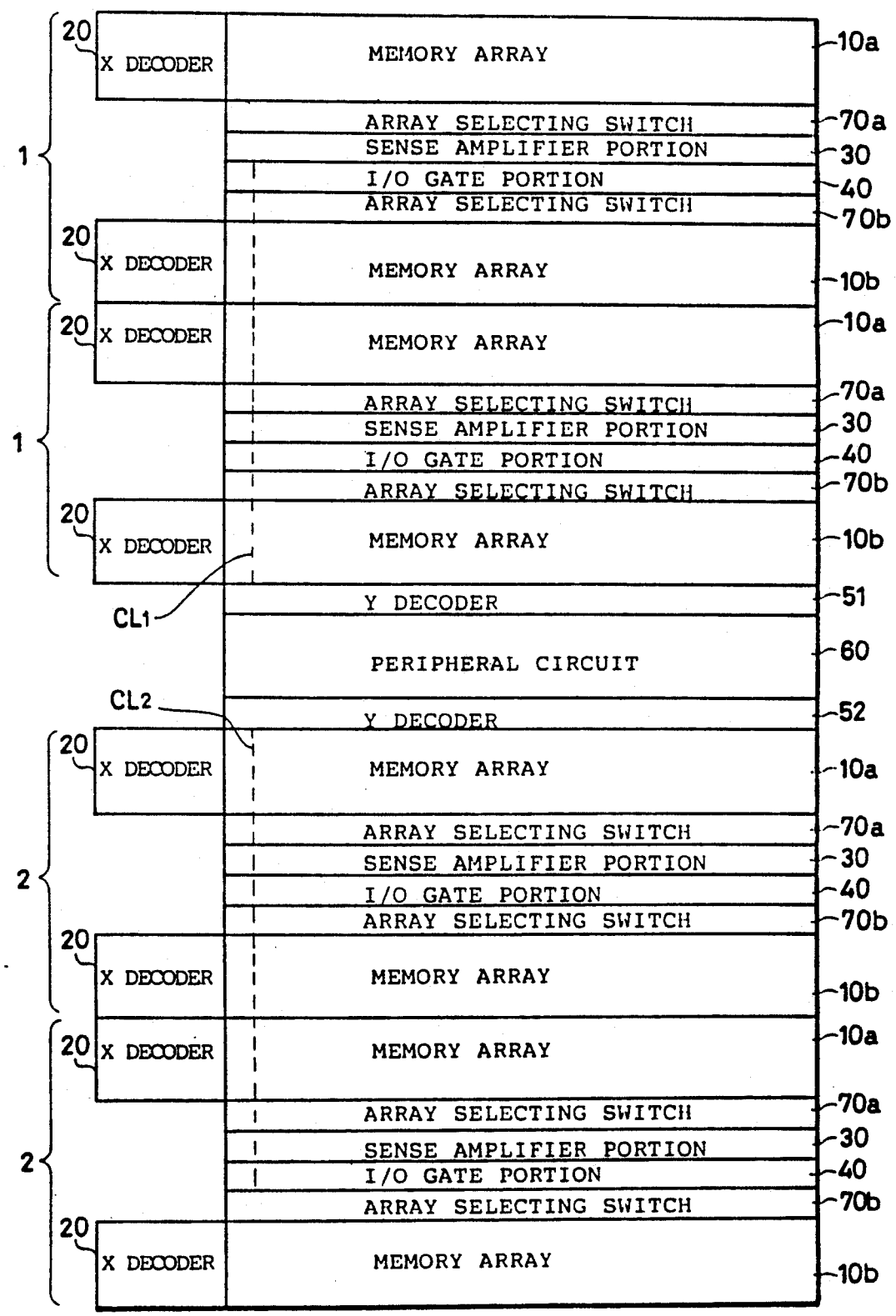
FIG. 2 is a block diagram showing the entire layout of the DRAM shown in FIG. 1.

FIG. 2 is a diagram showing the entire layout of a DRAM according to an embodiment of the present invention.

In FIG. 2, eight memory arrays are aligned. The eight memory arrays are divided into four blocks 1, 2, each of the blocks 1, 2 comprising memory arrays 10a and 10b. The four blocks 1, 2 are divided at the central portion thereof into parts each comprising two blocks. A peripheral circuit 60 is arranged in the central portion thereof, Y decoders 51 and 52 being arranged with the peripheral circuit 60 interposed therebetween. An X decoder 20 is provided for each of the eight memory arrays.

A first array selecting switch 70a for selecting the memory array 10a, a second array selecting switch 70b for selecting the memory array 10b, and a sense amplifier portion 30 and an I/O gate portion 40 which are common thereto are provided between the memory arrays 10a and 10b in each block.

Furthermore, a plurality of first column selecting lines CL1, CL2 are provided so as to cross the three memory arrays arranged on one side of the peripheral circuit 60 from the Y decoder 51 to the I/O gate portion 40. In addition, a plurality of second column selecting lines are provided so as to cross the three memory arrays arranged on the other side of the peripheral circuit 60 from the Y decoder 52 to the I/O gate portion 40. In FIG. 2, a single typical first column selecting line CL1 and a single typical second column selecting line CL2 are typically represented by broken lines.

Figure 7:
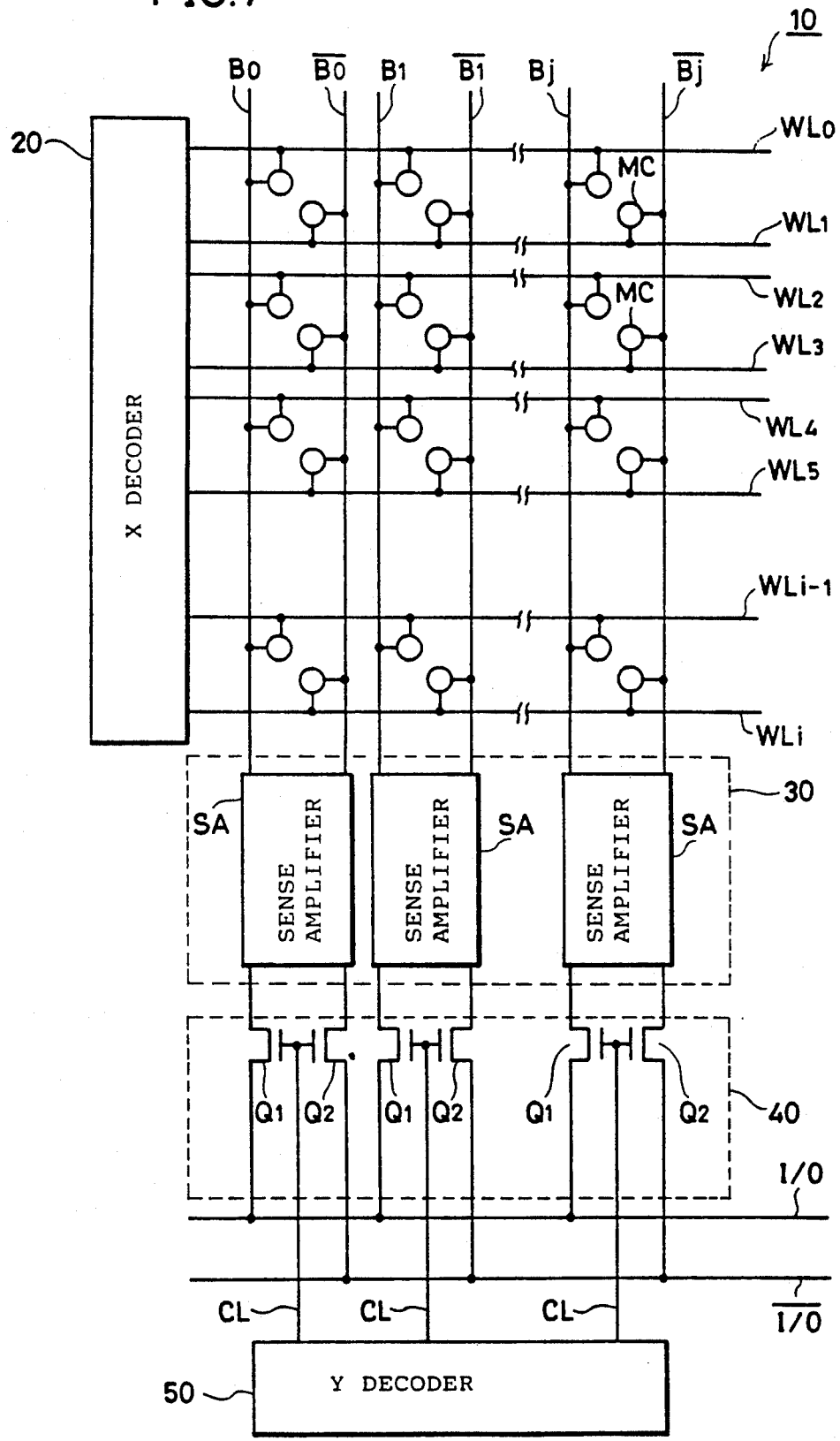
FIG. 7 is a diagram showing a general structure of a memory array in a DRAM.
Figure 11:
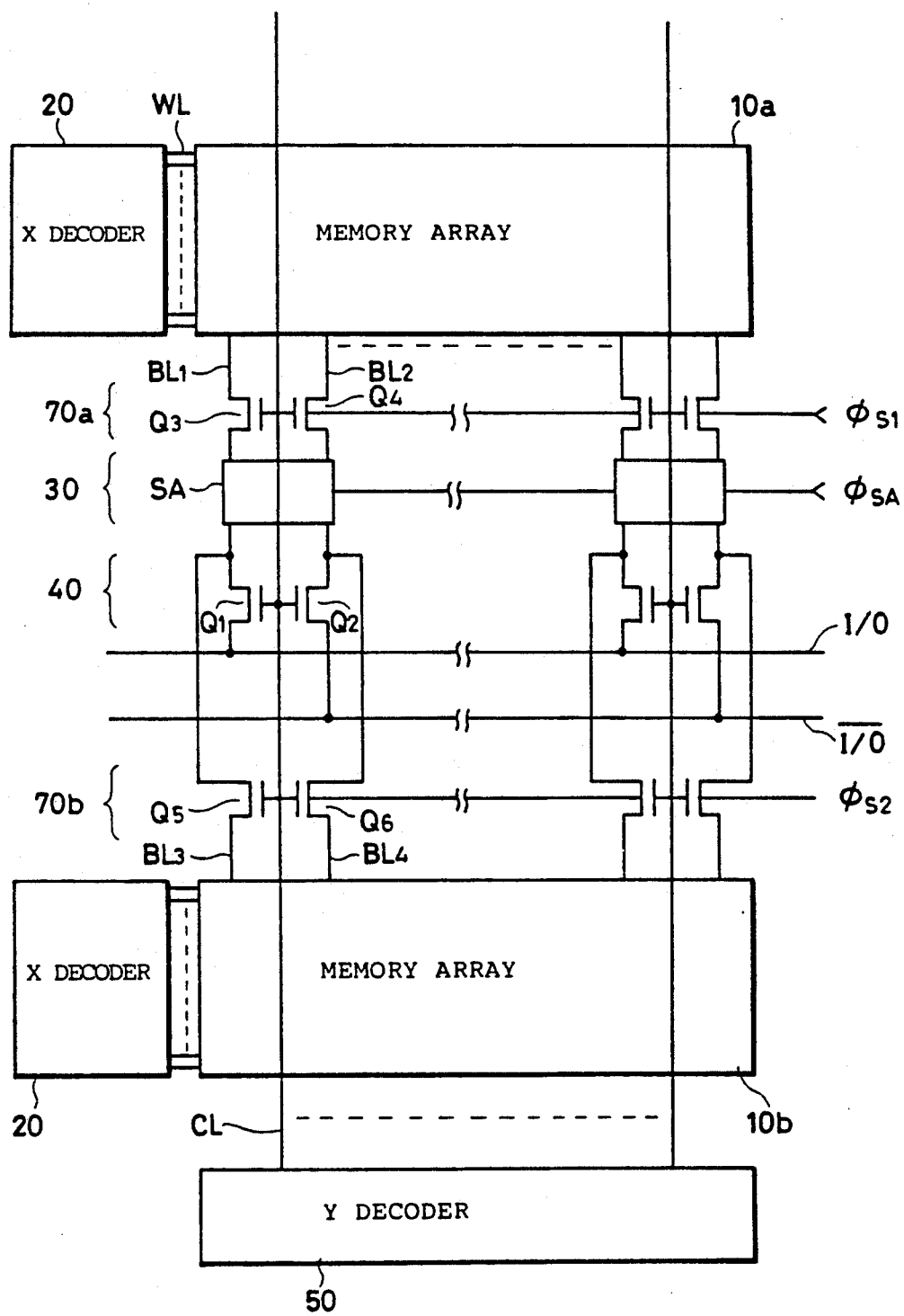
FIG. 11 diagram showing a structure of a main part of a DRAM using a shared sense amplifier.
Figure 12:
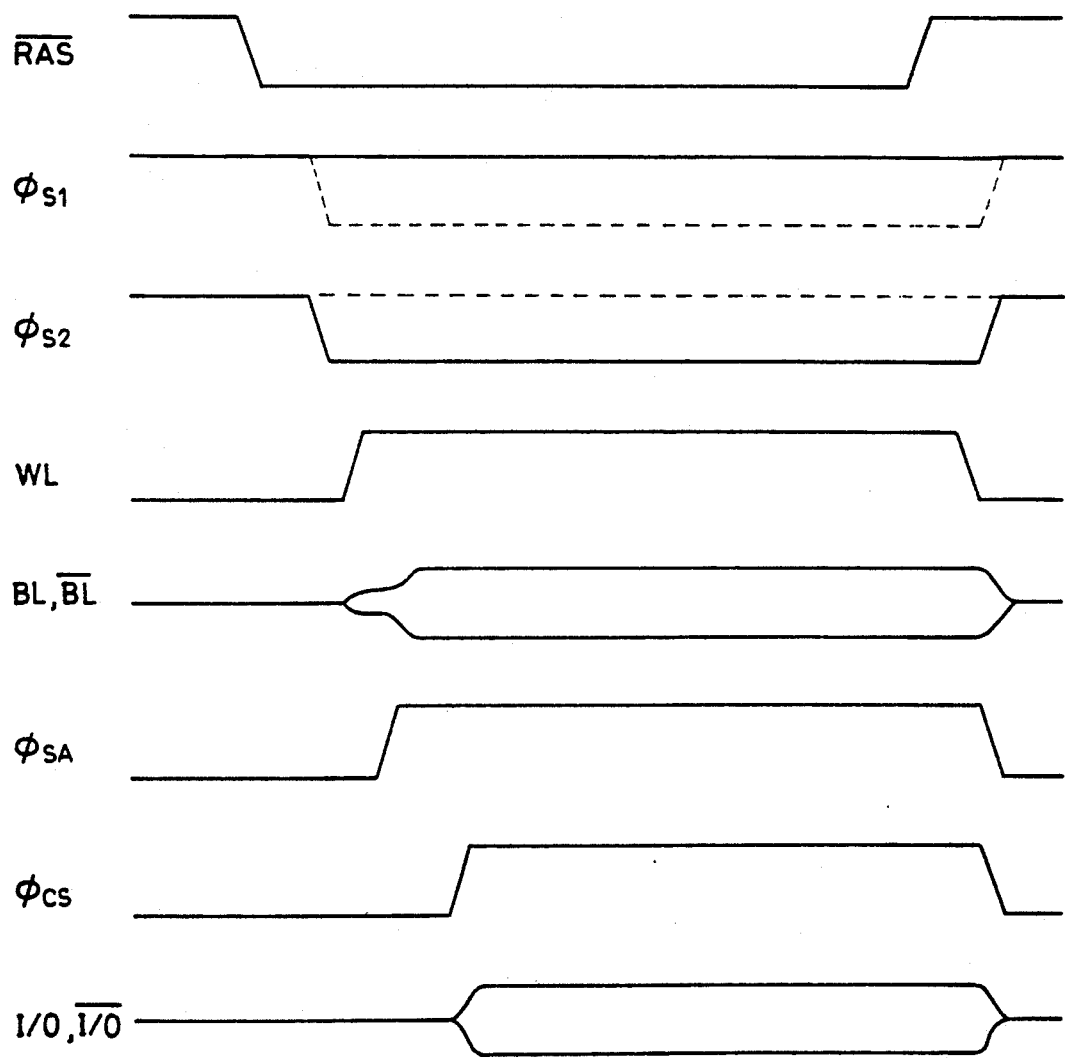
FIG. 12 is a timing chart for explaining an operation of the shared sense amplifier.
Figure 13:
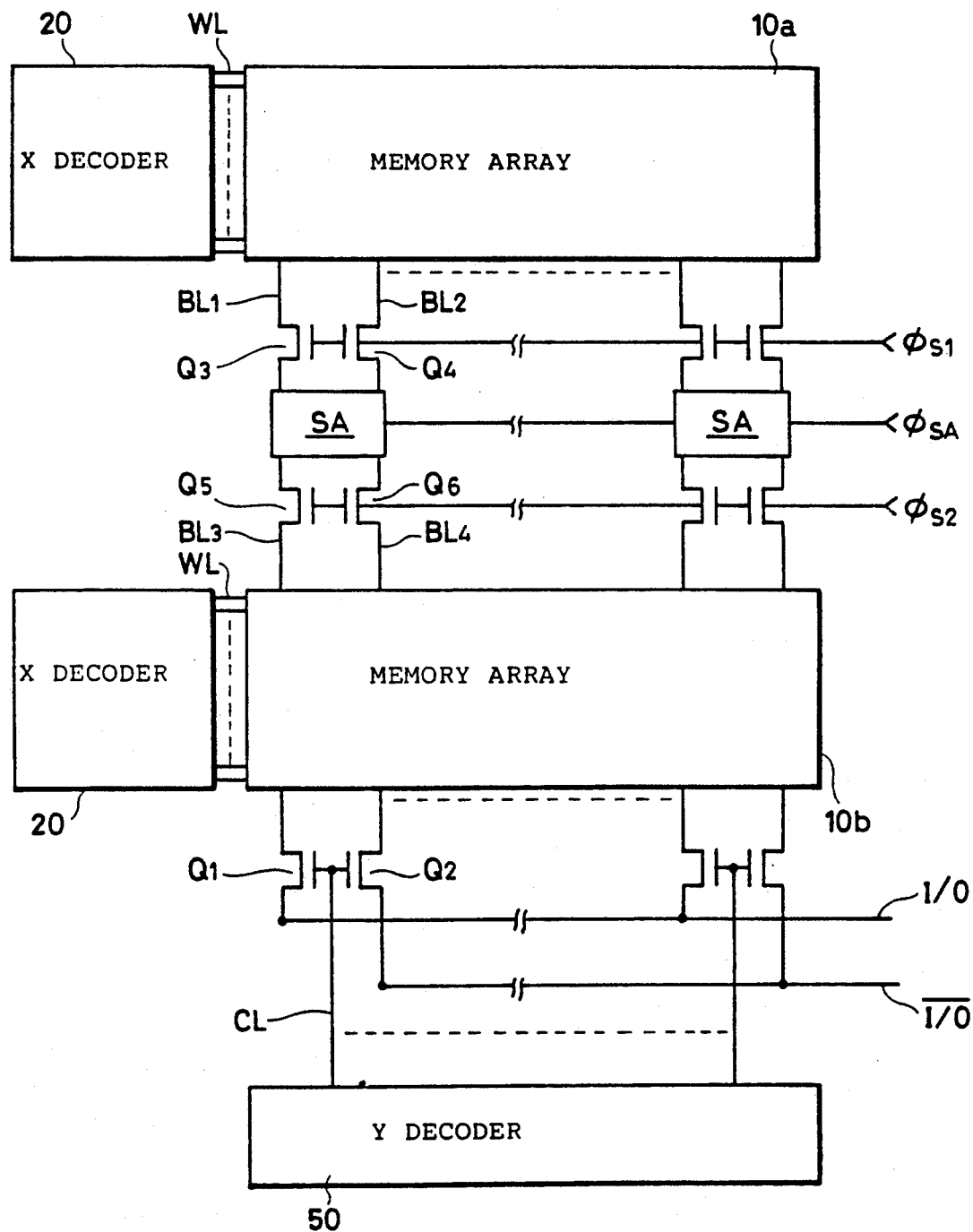
FIG. 13 is a circuit diagram showing a structure of a main part of a DRAM using a shared sense amplifier of a type in which column selecting lines do not cross memory arrays.

A structure of each of the memory arrays 10a and 10b is the same as that of the memory array 10 shown in FIG. 7. In addition, structures of the first array selecting switch 70a, the sense amplifier portion 30, the I/O gate portion 40 and the second array selecting switch 70b are the same as those shown in FIG. 11.

Figure 3:
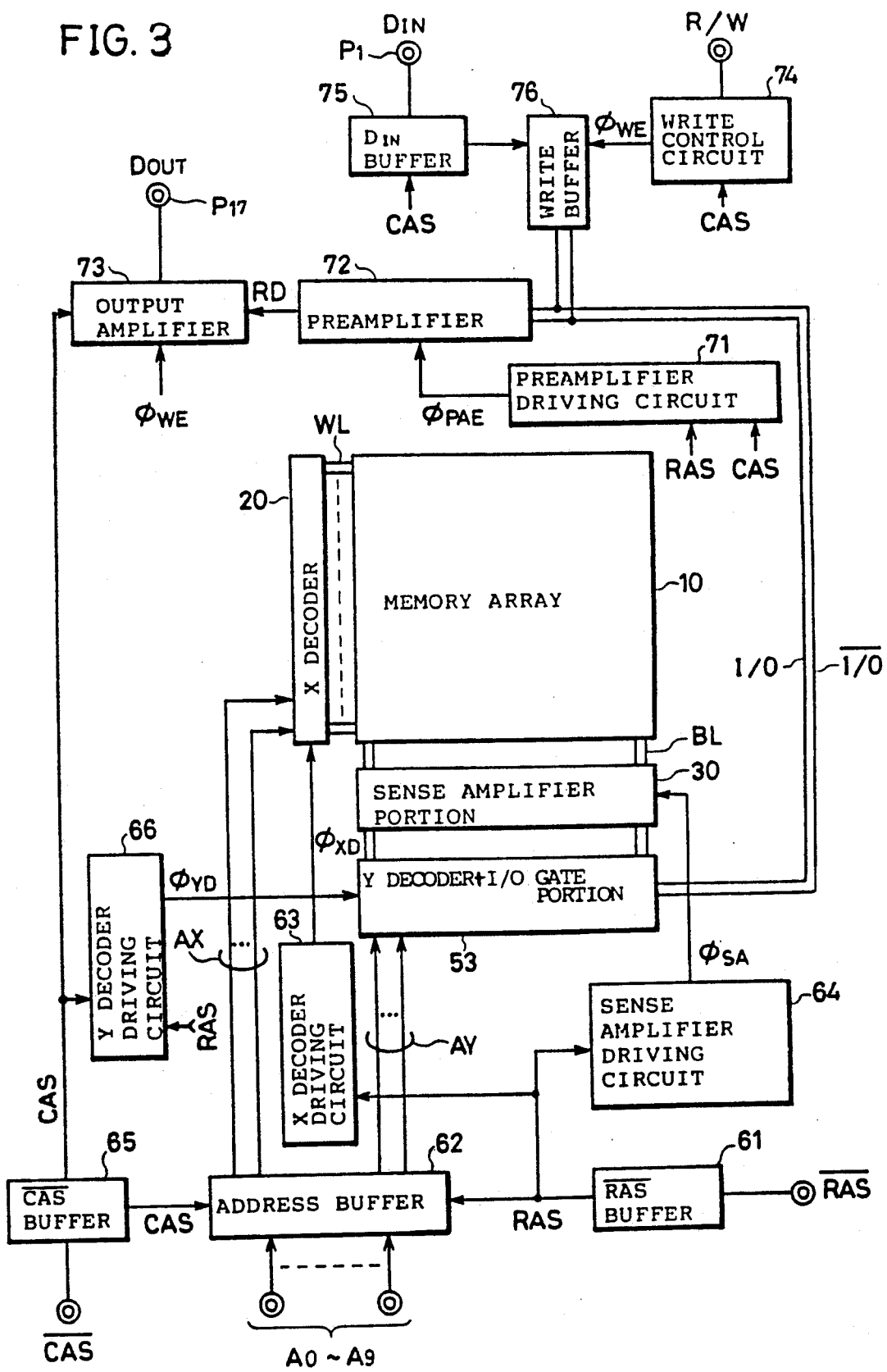
FIG. 3 is a block diagram showing a structure of a peripheral circuit included in the DRAM shown in FIG. 1.

FIG. 3 is a block diagram for explaining a structure of the peripheral circuit 60 shown in FIG. 2. In FIG. 3, a $\overline{RAS}$ buffer 61 is responsive to an externally applied row address strobe signal $\overline{RAS}$ for generating an internal row address strobe signal RAS. An address buffer 62 is triggered by the internal row address strobe signal RAS, to accept externally applied address signals A0 to A9 to generate X address signals Ax. An X decoder driving circuit 63 is responsive to the internal row address strobe signal RAS for generating an X decoder driving signal $\phi_{XD}$. An X decoder 20 is responsive to this X decoder driving signal $\phi_{XD}$ for selecting a single word line in accordance with the X address signals, to raise a potential thereon. A sense amplifier driving circuit 64 is responsive to the internal row address strobe signal RAS for generating a sense amplifier activating signal $\phi_{SA}$ after predetermined delay. A sense amplifier portion 30 is responsive to this sense amplifier activating signal $\phi_{SA}$ for amplifying a potential difference between bit lines.

On the other hand, a $\overline{CAS}$ buffer 65 is responsive to an externally applied column address strobe signal $\overline{CAS}$ for generating an internal column address strobe signal CAS. The address buffer 62 is triggered by this internal column address strobe signal CAS, to accept the externally applied address signals A0 to A9 and generate Y address signals AY. A Y decoder driving circuit 66 is responsive to the internal column address strobe signal CAS for generating a Y decoder driving signal $\phi_{YD}$. A block 53 comprising a Y decoder and an I/O gate portion is responsive to this Y decoder driving signal $\phi_{YD}$ for connecting a single bit line pair to an input/output line pair I/O and $\overline{I/O}$ in accordance with the Y address signals AY.

A preamplifier driving circuit 71 is responsive to the internal row address strobe signal RAS and the internal column address strobe signal CAS for generating a preamplifier driving signal $\phi_{PAE}$. A preamplifier 72 responsive to this preamplifier driving signal $\phi_{PAE}$ for amplifying information on the input/output line pair I/O and $\overline{I/O}$, to send the same to an output amplifier 73 as read-out data RD. The output amplifier 73 is responsive to the internal column address strobe signal CAS for amplifying the read-out data RD, to output the same to an external data output pin P17 as output data $D_{OUT}$.

Furthermore, a write-in control circuit 74 is triggered by the internal column address strobe signal CAS, to accept an externally applied control signal R/W to generate a write enable signal $\phi_{WE}$. A $D_{IN}$ buffer 75 is triggered by the internal column address strobe signal CAS, to accept input data $D_{IN}$ applied to an external data input pin P1 to generate internal write-in data. A write-in buffer 76 is responsive to the write enable signal $\phi_{WE}$ for transferring the internal write-in data to the input/output line pair I/O and $\overline{I/O}$.

In the above described manner, data in the memory array 10 is outputted to the external data output pin P17, and the data applied to the external data input pin P1 is written in the memory array 10.

The peripheral circuit 60 shown in FIG. 2 comprises the $\overline{RAS}$ buffer 61, the address buffer 62, the X decoder driving circuit 63, the sense amplifier driving circuit 64, the $\overline{CAS}$ buffer 65, the Y decoder driving circuit 66, the write-in control circuit 74, and the $D_{IN}$ buffer 75 as shown in FIG. 3.

Figure 14:
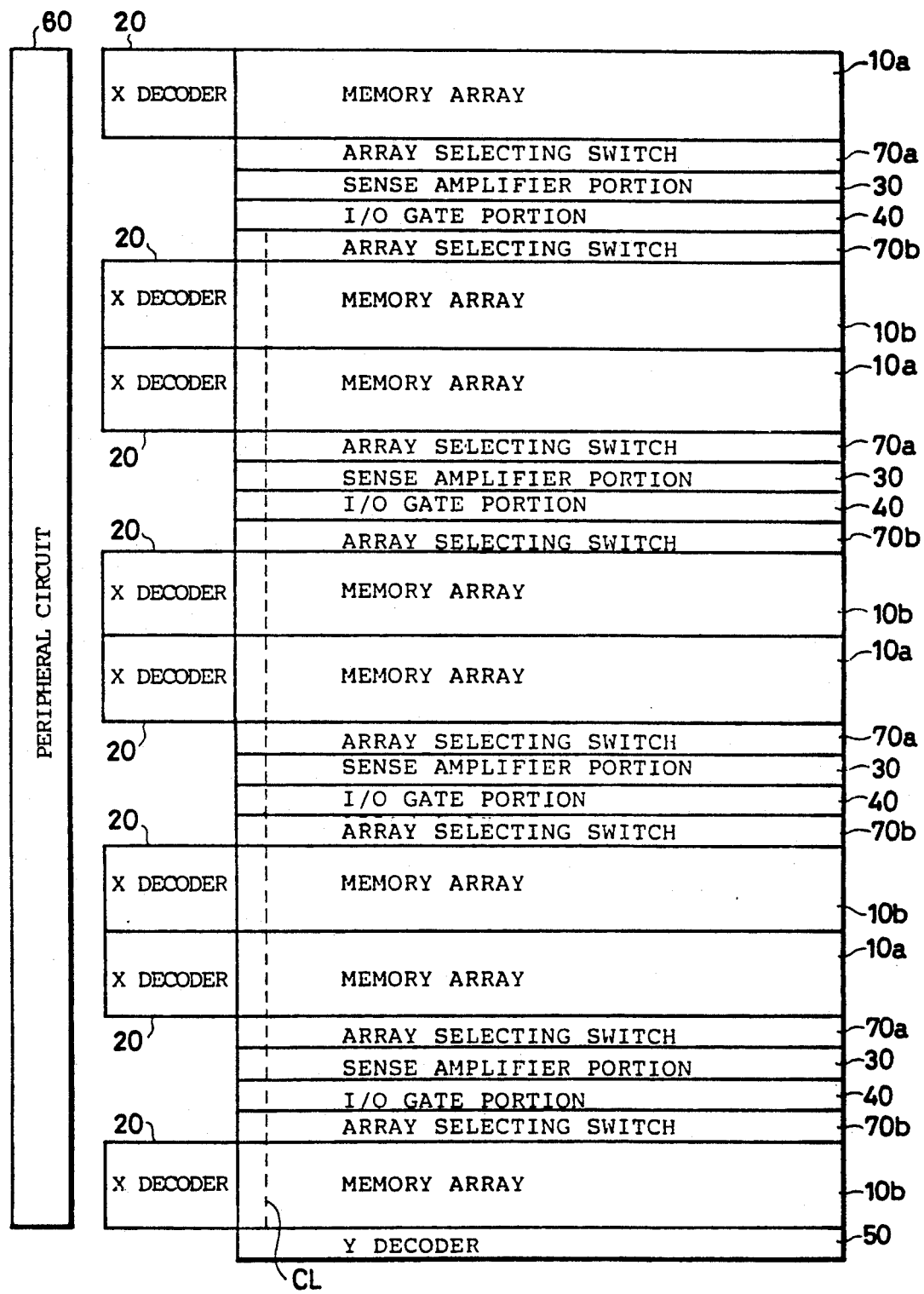
FIG. 14 is a block diagram showing the layout of another conventional DRAM.
Figure 15:
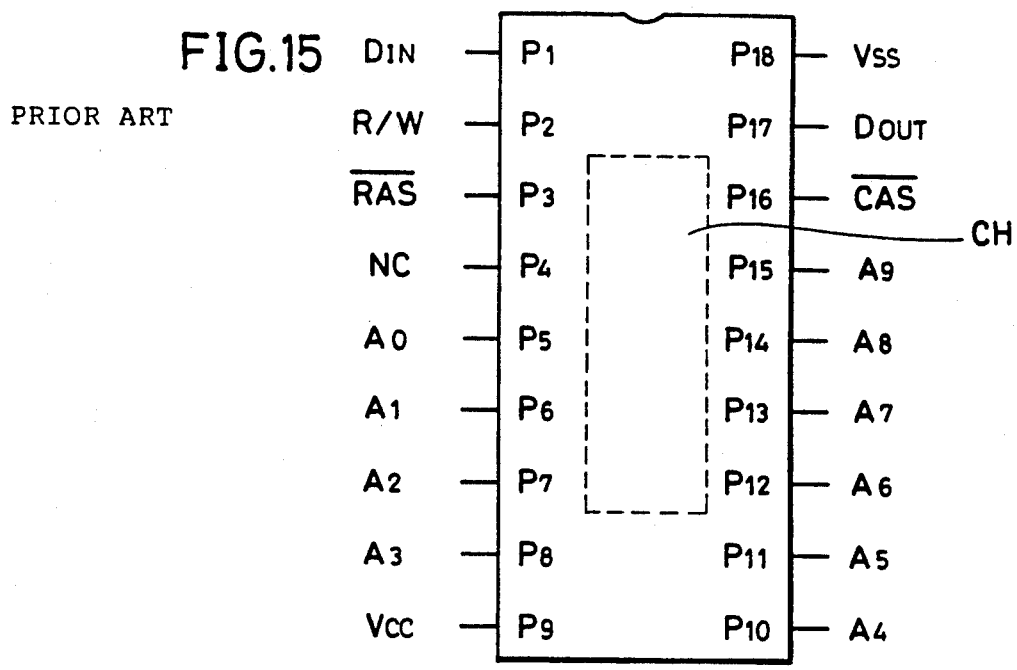
FIG. 15 is a diagram showing a pin arrangement of a package of a general 1 M-bit DRAM.

In the DRAM shown in FIG. 2, the length of each of the column selecting lines becomes approximately one-half of that in the conventional DRAM shown in FIG. 14, so that the delay time of a column selecting signal becomes approximately one-half. Therefore, the access time in the DRAM can be shortened. In addition, since the Y decoders 51 and 52 are arranged in the vicinity of the peripheral circuit 60, interconnections LY such as the Y address lines connected from the peripheral circuit 60 to the Y decoders 51 and 52 become shorter to enable reduction of chips area (referring to FIG. 1). In addition, the length of the longest interconnection out of interconnections LX such as X address lines connected from the peripheral circuit 60 to the X decoders 20 becomes a minimum (referring to FIG. 1). Thus, the delay of signals is reduced and the chip area is further reduced.

Figure 10A:
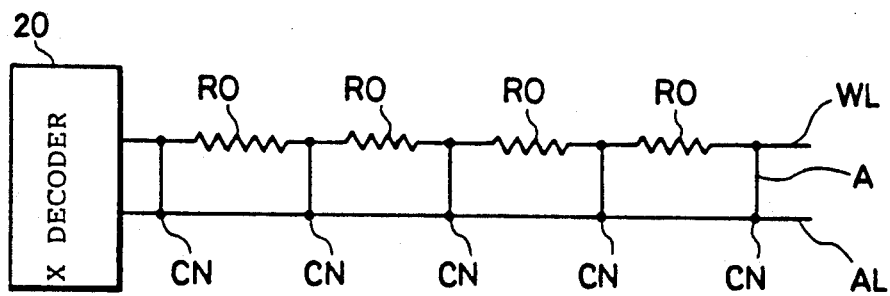
FIG. 10A is a diagram for explaining a shunt interconnection for a word line.
Figure 10B:
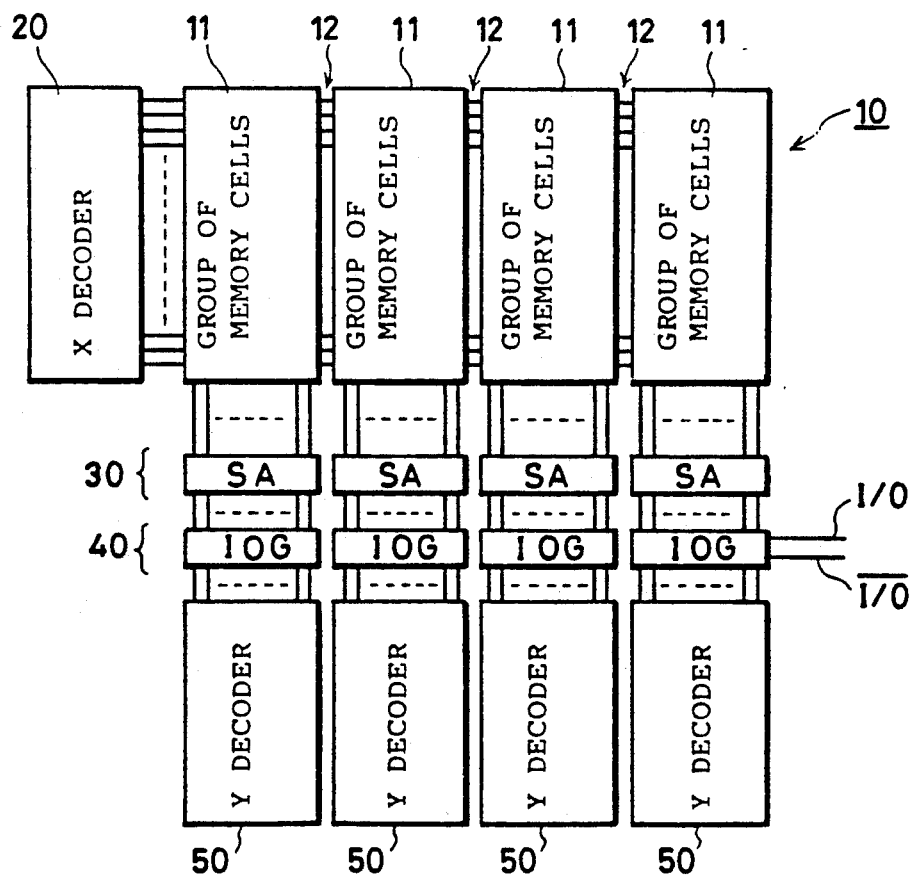
FIG. 10B is a block diagram showing a structure of a memory cell of a conventional DRAM using the shunt interconnection for a word line.

FIG. 1 is a diagram showing a structure of half of a chip of the DRAM shown in FIG. 2. A shunt interconnection is provided for a word line WL in each of memory arrays 10a and 10b, as shown in FIG. 10A. Each of the memory arrays 10a and 10b is divided into four groups 11 of memory cells. The spacing 12 for connection A between a shunt portion and a word line WL is provided between the adjacent groups 11 of memory cells. No column selecting line CL passes through this spacing 12 for a word line shunt connection A. Thus, interconnection layers L for connecting a peripheral circuit 60 to pads PD are passed above this spacing 12 for a word line shunt connection A in the plane of the second Al layer. This interconnection layer L is used as an interconnection such an external signal interconnection, a power supply line and a ground line for transmitting an external signal, a power-supply potential, a ground potential or the like from the pads PD to the peripheral circuit 60 in the central portion. This interconnection layer L can be formed of the same type of layer as that of the column selecting line CL.

Figure 4B:
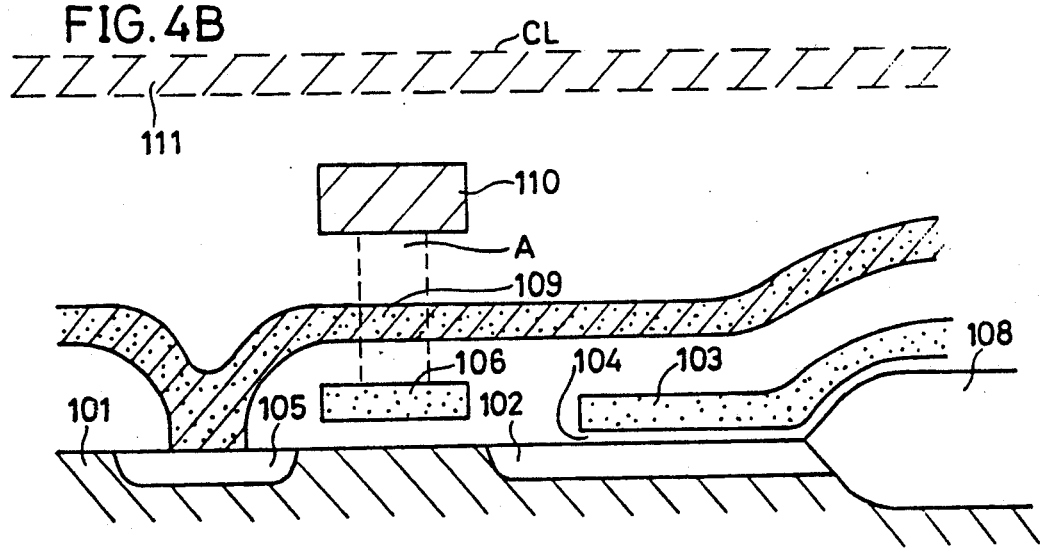
FIG. 4B is a cross-sectional view showing memory cells included in the memory array shown in FIG. 3.
Figure 4A:
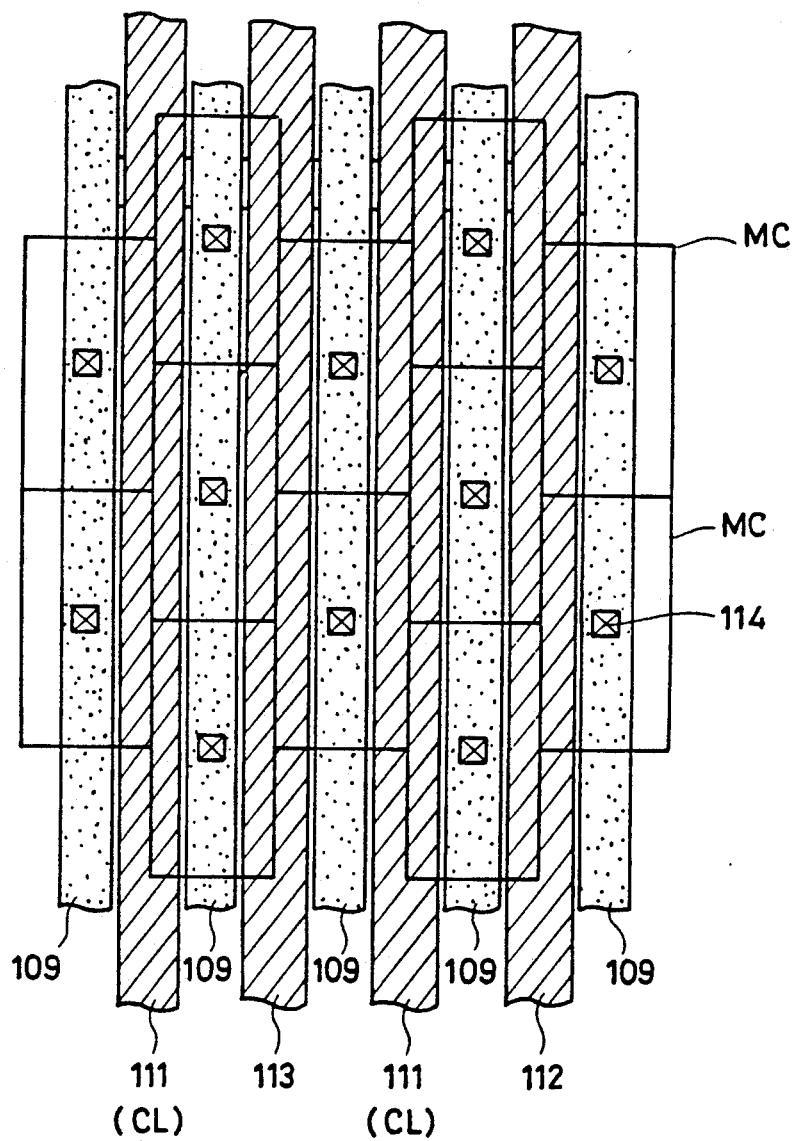
FIG. 4A is a diagram showing the plane layout of a part of each of the memory arrays shown in FIG. 3.

FIG. 4A is a diagram showing a plane pattern of a part of a memory array, and FIG. 4B is a cross-sectional view showing a memory cell included in the DRAM according to the present embodiment.

Figure 8A:
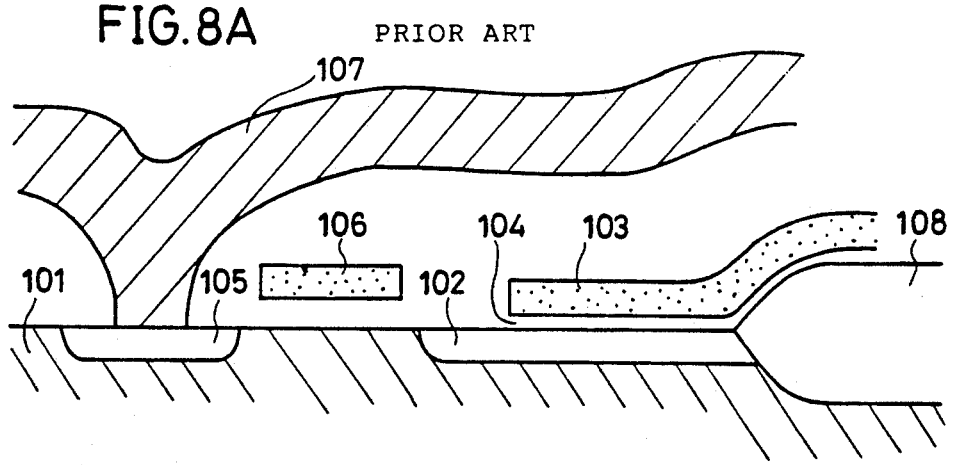
FIG. 8A is a cross-sectional view showing one example of a memory array in a DRAM.
Figure 8B:
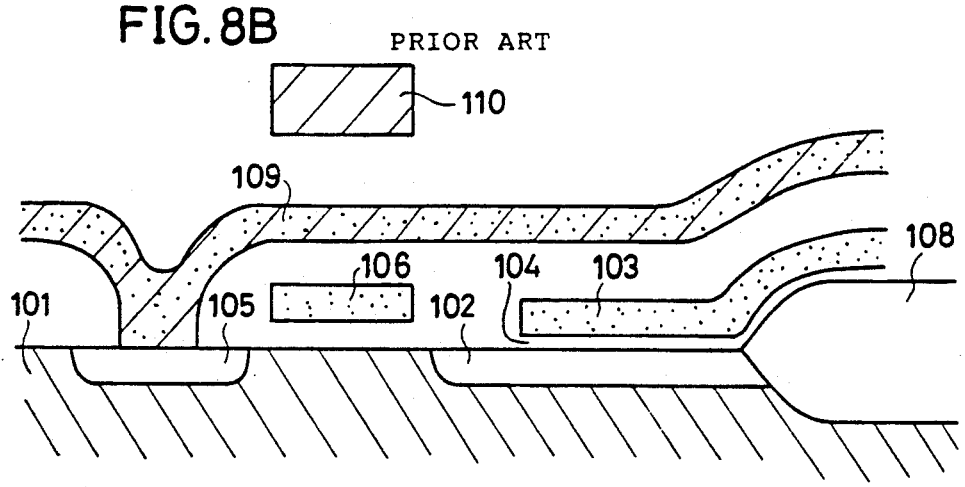
FIG. 8B is a cross-sectional view showing another example of a memory cell in the DRAM.
Figure 8C:
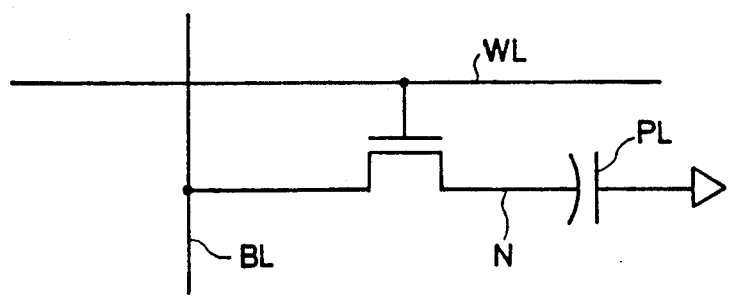
FIG. 8C is a diagram showing an equivalent circuit of a memory cell.
Figure 9:
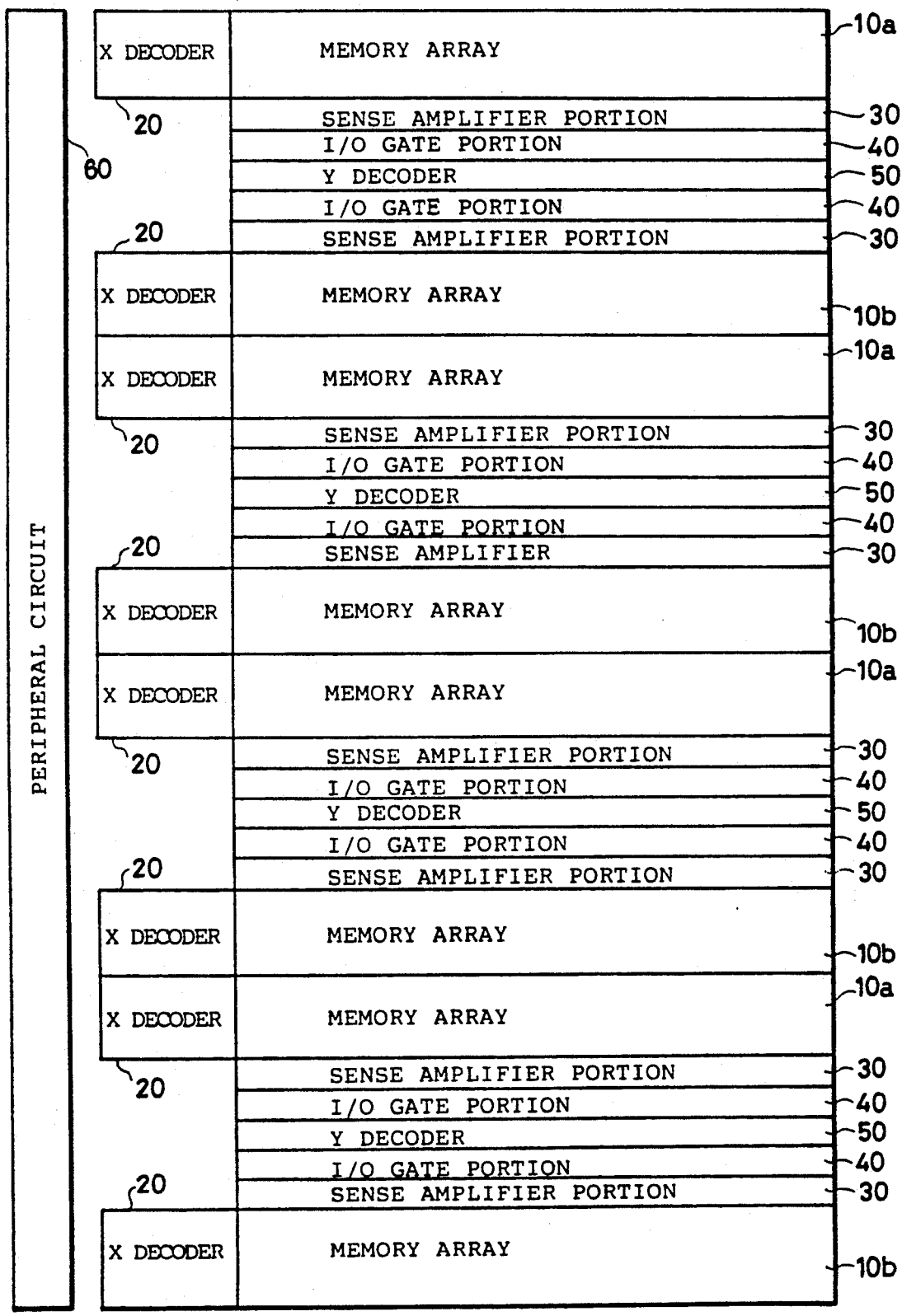
FIG. 9 is a block diagram showing the layout of a conventional DRAM.

As shown in FIG. 4B, a cell plate is formed of a first polysilicon layer 103, a word line is formed of a second polysilicon layer 106, and a bit line is formed of a third polysilicon layer 109, as in the memory cell shown in FIG. 8B. In addition, a shunt interconnection for a word line is formed of a first aluminum layer 110. Meanwhile, a gate electrode, i.e., a word line of an access transistor may be formed of a polyside layer comprising siliside and polysilicon, and the shunt interconnection for a word line may be formed of a metal interconnection layer having low resistance other than aluminum.

Additionally, as shown in FIG. 4A, each of memory cells MC is connected to a bit line formed of a third polysilicon layer 109 in a contact portion 114. A single bit line formed of a third polysilicon layer 109 is provided for memory cells MC in one column. In addition, a column selecting line formed of a second aluminum layer 111 is provided between a single bit line pair formed of a third polysilicon layer 109.

Meanwhile, the second aluminum layer 111 to be a column selecting line is provided in the upper portion of a memory cell, as shown in, for example, FIG. 4B.

Since not more than one column selecting line formed of the second aluminum layer 111 is required for each bit line pair, a pitch of two times that between bit lines would be sufficient as a spacing of column selecting lines. Thus, an interconnection formed of the second aluminum layer 111 can be provided between two column selecting lines each formed of the second aluminum layer 111.

As shown in FIG. 4A, similarly, interconnection layers formed of second aluminum layers 112 and 113 can be provided between the column selecting lines each formed of the second aluminum layer 111. An external signal line, a power supply line, a ground line and the like can be provided from the pads PD to the peripheral circuit 60 in the central portion by using the second aluminum layers 112 and 113.

As described in the foregoing, the power supply line and the ground line must be made thicker than the other external signal lines. Therefore, a plurality of power supply lines and ground lines are run between a plurality of column selecting lines so that the plurality of power supply lines and the plurality of ground lines are respectively connected to each other in the peripheral circuit 60 in the central portion, thereby to obtain the same effect as that obtained when a single thick interconnection is provided.

In the conventional DRAM, since interconnections such as an external signal line, a power supply line and a ground line connected from pads to a peripheral circuit are provided outside of memory arrays, the chip area is increased. On the other hand, in the present embodiment, since interconnections such as an external signal line, a power supply line and a ground line are provided so as to cross memory arrays, as shown in FIGS. 1 and 4A, the area required for the interconnections is reduced, so that the chip area can be reduced.

Figure 5:
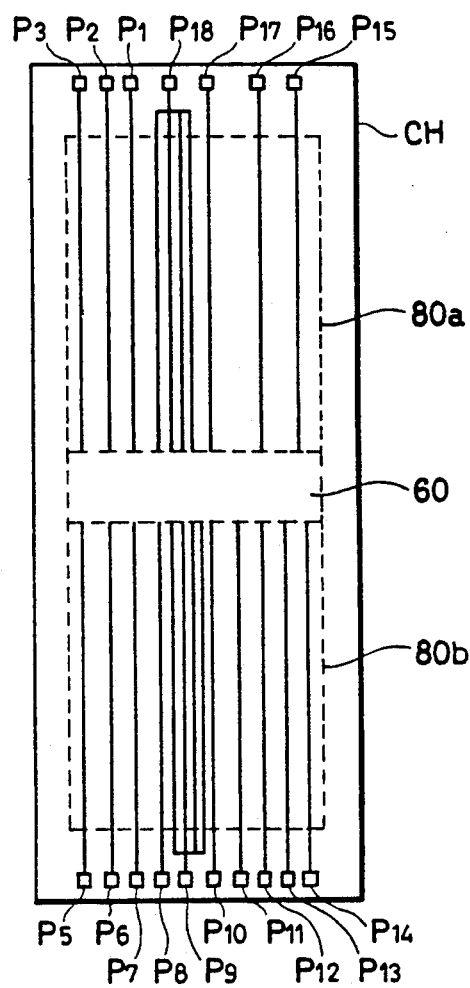
FIG. 5 is a diagram showing interconnections on a chip of the DRAM shown in FIG. 1.

FIG. 5 is a diagram showing a chip of the DRAM according to the present embodiment.

Figure 16:
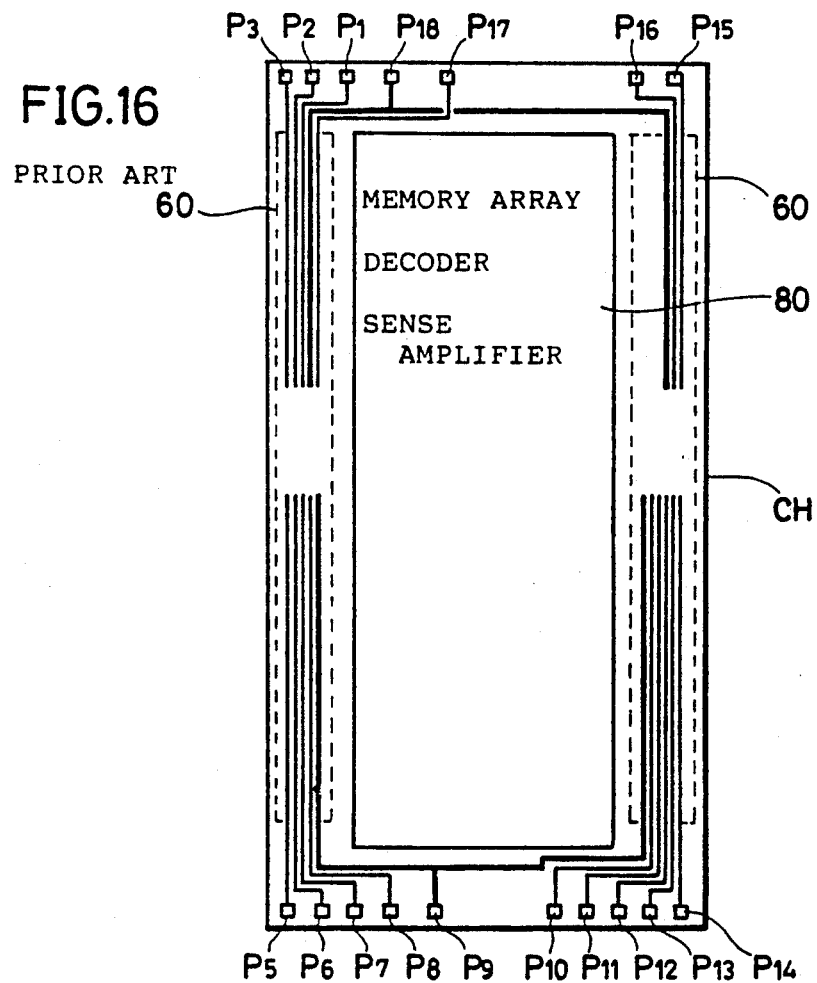
FIG. 16 showing interconnections on a chip of a conventional 1 M-bit DRAM.

As shown in FIG. 5, pads p1 to p18 are provided in both ends of the chip CH. Interconnections such as an external signal line, a power supply line and a ground line connected between the pads p1 to p18 and a peripheral circuit 60 are provided so as to cross a first circuit portion 80a or a second circuit portion 80b each comprising memory arrays, decoders, sense amplifiers and the like. In the DRAM according to the present embodiment, since the peripheral circuit 60 is provided in the central portion of the chip CH, and the interconnections such as an external signal line, a power supply line and a ground line are not provided in the peripheral portion of the chip CH as compared to prior art FIG. 16 but provided so as to cross memory arrays, the length of the chip CH in the direction of a short side of the chip is reduced. Since the interconnections are formed of the same interconnection layer as that forming column selecting lines CL, a special layer need not be provided in order for the interconnections cross to the memory arrays.

Figure 6:
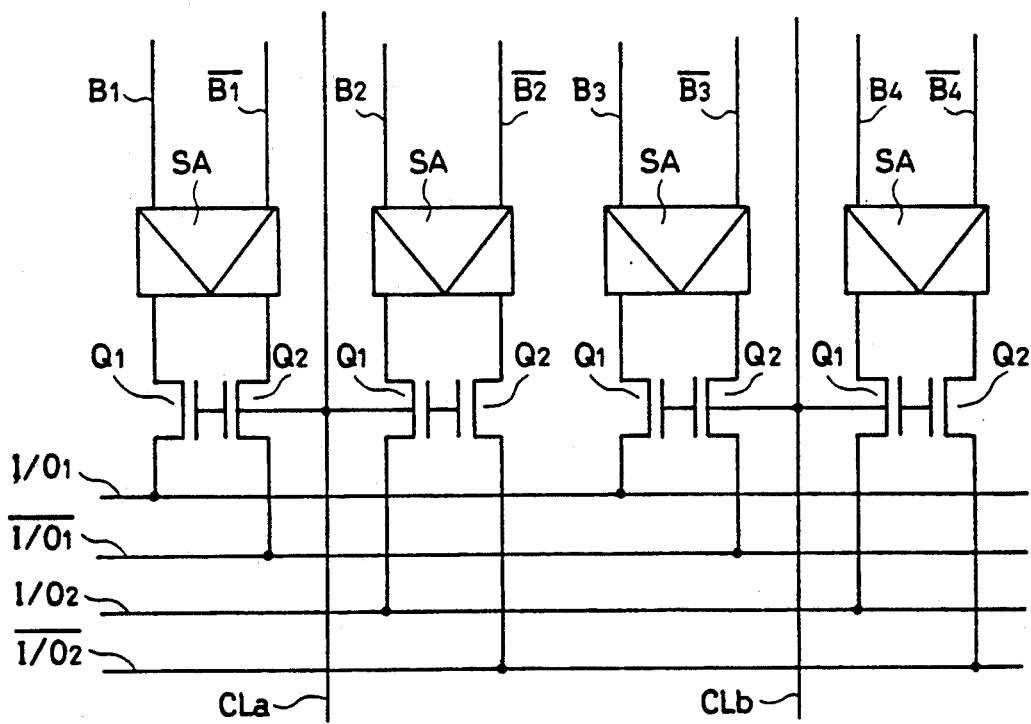
FIG. 6 is a diagram showing a structure of a main part of another DRAM to which the present invention can be applied.

Additionally, in a recent DRAM, a structure comprising two input/output line pairs as shown in FIG. 6 is employed in many cases. In FIG. 6, when a column selecting line CLa is activated, a bit line pair BL and $\overline{BL}$ is connected to an input/output line pair I/O1 and I/O1 and at the same time, a bit line pair B2 and $\overline{B2}$ is connected to an input/output line pair I/O2 and $\overline{I/O2}$. In addition, when a column selecting line CLb is activated, a bit line pair B3 and $\overline{B3}$ is connected to the input/output line pair I/O1 and $\overline{I/O1}$ and at the same time, a bit line pair B4 and $\overline{B4}$ is connected to the input/output line pair I/O2 and $\overline{I/O2}$. In a DRAM having a structure shown in FIG. 6, a spacing of column selecting lines becomes four times that of bit lines. Thus, if a structure shown in FIGS. 3 and 4A is applied to the DRAM shown in FIG. 6, a thicker interconnection can be passed between the column selecting lines.

Although in the above described embodiment, description was made on a case in which the present invention is applied to a DRAM having a shunt interconnection for a word line, the present invention can be also applied to a semiconductor memory device such as a DRAM having no shunt interconnection for a word line. That is, the present invention does not rely on the provision of space 12.

In the above described embodiment, description was also made on a case in which the present invention is applied to a DRAM wherein two Y decoders provided in the vicinity of the peripheral circuit select columns in a plurality of memory arrays, respectively. But the application of the present invention is also possible in the other semiconductor memory devices, and is not limited only to such a DRAM as described above.

In addition, the present invention can be also applied to a semiconductor memory device having no shunt interconnection for a word line.

As described in the foregoing, according to the present invention, the interconnections connected between pads on a semiconductor chip and circuit means are provided so as to cross first and second memory means so that the area required for the interconnections is reduced. Thus, the semiconductor memory device with a reduced chip area is obtained.

What is claimed is:

1. A semiconductor memory device comprising:
   a semiconductor chip;
   a first memory means provided on said semiconductor chip and formed of a predetermined layers;
   second memory means provided on said semiconductor chip and formed of predetermined layers;
   driving circuit means comprising a peripheral circuit provided on said semiconductor chip for driving said first and second memory means, said first and second memory means being arranged in a common column on one and the other sides of said driving circuit means, respectively;
   one ore more pads provided on said semiconductor chip for receiving externally applied signals and predetermined potentials, said driving circuit means and the pads are all arranged in said common column; and
   interconnecting means, including interconnections formed of a layer other than said predetermined layers, for interconnecting said pads and said driving circuit mean; wherein
   said interconnections are provided so as to cross one of said first and second memory means, whereby no additional chip area is required to form said interconnections,
   said first memory means includes a first memory array,
   said second memory means includes a second memory array,
   each of said first and second memory arrays includes a plurality of memory cells arranged in a plurality of columns and in a plurality of rows, a plurality of word lines provided corresponding to said plurality of rows and each connected to the memory cells belonging to the corresponding row, and a plurality of bit lines provided corresponding to said plurality of columns and each connected to the memory cells belonging to the corresponding column,
   each of said first and second memory arrays is divided with predetermined spacings into a plurality of blocks so as to divide each of said plurality of word lines at a plurality of points, and
   said interconnections are provided so as to cross said first and second memory arrays in said predetermined spacing region between said plurality of blocks; and
   further including a plurality of low resistance lines provided above said plurality of word lines in parallel thereto, each of said plurality of low resistance lines being connected to the corresponding word line at said plurality of points.

2. The semiconductor memory device according to claim 1, which further comprises
   column selecting means formed on said semiconductor chip for selecting any of said plurality of columns of said first and second memory arrays,
   first and second row selecting means provided on said semiconductor chip corresponding to said first and second memory arrays, each selecting any of said plurality of word lines of the corresponding memory array.

3. The semiconductor memory device according to claim 2, wherein
   said circuit means comprises buffer circuits for said externally applied signals.

4. The semiconductor memory device according to claim 5, wherein
   said externally applied signals include a control signal, an address signal and data.

5. The semiconductor memory device according to claim 3, wherein
   said driving circuit means further comprises
   a first driving circuit for driving said first and second row selecting means in response to the outputs of said buffer circuit,
   a second driving circuit for driving said column selecting means in response to the outputs of said buffer circuit, and
   a sense amplifier driving circuit for driving said plurality of sense amplifier means in response to the outputs of said buffer circuit.

6. The semiconductor memory device according to claim 2, wherein
   said first memory array is divided into a plurality of first memory array blocks,
   said second memory array is divided into a plurality of second memory array blocks,
   said first row selecting means includes a plurality of row selecting means provided corresponding to said plurality of first memory array blocks,
   said second row selecting means includes a plurality of row selecting means provided corresponding to said plurality of second memory array blocks.

7. The semiconductor memory device according to claim 6, which further comprises
   a plurality of sense amplifier means provided corresponding to said plurality of first and second memory array blocks, each amplifying information read out of the memory cells in the corresponding first and second memory arrays blocks.

8. The semiconductor memory device according to claim 7, wherein
each of said plurality of first and second memory array blocks is divided into a first subarray and a second subarray,
each of said plurality of sense amplifier means is arranged between the corresponding first and second subarrays,
and which further comprises
a plurality of array selecting means provided corresponding to said plurality of sense amplifier means, each connecting selectively the corresponding sense amplifier means to either one of the corresponding first and second subarrays.

9. A semiconductor device comprising:
a semiconductor chip having long and short sides
a plurality of memory arrays formed on said chip and arranged in a direction parallel to the long side of said chip,
a memory drive means comprising a peripheral circuit for selectively driving said memory arrays over a plurality of column select lines running parallel to said long side of said chip, the widths of said column select lines being less than the widths of corresponding columns of memory cells in said arrays thereby providing spaces between said column select lines, said memory arrays in response to control signals applied to said driving means, said memory drive means being centrally located among said plurality of memory arrays,
connection means for providing said control signals directly to said peripheral circuit, and
power/ground connection means provided in said spaces between said column select lines for supplying power to said memory drive means,
whereby a dimension of said semiconductor chip in the direction of the short side thereof is reduced.

10. The semiconductor device as recited in claim 9, wherein said connection means is provided in said spaces between said column select lines,
whereby the dimension of said semiconductor chip is further reduced in the direction of the short side thereof.

11. The semiconductor device as recited in claim 9, wherein a column decoder is provided in common for a plurality of said memory arrays,
whereby the dimension of said semiconductor chip is reduced in the direction of the long side thereof.

12. The semiconductor device as recited in claim 9, wherein a sense amplifier means is provided in common for a plurality of said memory arrays,
whereby the dimension of said semiconductor chip is reduced in the direction of the long side thereof.

13. The semiconductor device as recited in claim 9, wherein an input/output means is provided in common for a plurality of said arrays,
whereby the dimension of said semiconductor chip is reduced in the direction of the long side thereof.

14. The semiconductor device as recited in claim 9 wherein said power connection means is distributed in a plurality of said spaces between said column select lines.

15. A semiconductor memory device comprising:
a rectangular substrate having long and short sides,
a memory cell array comprising a plurality of memory cells formed on said substrate and disposed in a matrix of rows parallel to said short sides and columns parallel to said long sides, said memory cell array being divided into a plurality of columns such that a plurality of spacings are provided between said plurality of memory cells groups, each of said plurality of memory cells comprising one MOS transistor having a gate electrode and one storage means, said gate electrodes of said MOS transistors located at each row forming a first word line formed on a first layer over said rectangular substrate,
a plurality of bit lines provided corresponding to said columns and each connected to the memory cells on the corresponding column, said plurality of bit lines being formed on a second layer over said rectangular substrate,
a plurality of second word lines provided corresponding to said first word lines and each connected to the corresponding first word line at said spacings, said plurality of second word lines being formed of material having lower resistance than that of said first word lines and being formed on a third layer over said rectangular substrate,
a plurality of column selecting lines disposed at said columns and formed on a fourth layer over said rectangular substrate so as to cross said memory cell array,
a pad formed at one short side of said rectangular substrate and one end of said memory cell array and receiving a predetermined potential or signals, and
an interconnection line formed on said fourth layer at one of said spacings and electrically connected to said pad so as to cross said memory cell array.

16. A semiconductor memory device comprising:
a semiconductor substrate having long and short sides,
a memory cell array comprising a plurality of memory cells formed on said substrate and arranged in a plurality of columns parallel to said long sides and a plurality of rows parallel to said short sides,
a plurality of word lines provided corresponding to said plurality of rows and each connected to the memory cells belonging to the corresponding row, said plurality of word lines being formed on a first layer over said substrate,
a plurality of bit line pairs provided corresponding to said plurality of columns and each connected to the memory cells belonging to the corresponding column,
said plurality of bit line pairs being formed on a second layer over said substrate,
a plurality of column selecting lines provided corresponding to said plurality of columns and each for selecting the bit line pair belonging to the corresponding column;
said plurality of column selecting lines being formed on a third layer over said substrate so as to cross said memory cell array,
one or more pads provided on one of said short sides and on one side of said memory cell array on said substrate and for receiving predetermined potentials or signals, and
one or more interconnection lines provided between said plurality of column selecting lines in said third layer so as to cross said memory cell array and electrically connected to said pads.

17. A semiconductor device comprising:

a semiconductor chip, a first memory array provided on said semiconductor chip and formed of predetermined layers, a second memory array provided on said semiconductor chip and formed of predetermined layers, driving circuit means comprising a peripheral circuit provided on said semiconductor chip for driving said first and second memory arrays over a plurality of column select lines, the widths of said column select lines being less than the widths of corresponding columns of memory cells in said first and second memory arrays thereby providing spaces between said column select lines, said first and second memory means being arranged on one and the other sides of said driving circuit means, respectively, one or more pads provided on said semiconductor chip for receiving externally applied signals and predetermined potentials, and interconnecting means, including interconnections formed of a layer other than said predetermined layers, for interconnecting said pads and said driving circuit means, said interconnections being provided in said spaces between column select lines so as to cross one of said first and second memory means, whereby no additional chip area is required to form said interconnections.

18. The semiconductor memory device according to claim 17, wherein said first memory means includes a first memory array, said second memory means includes a second memory array, each of said first and second memory arrays includes a plurality of memory cells arranged in a plurality of columns and in a plurality of rows, a plurality of word lines provided corresponding to said plurality of rows and each connected to the memory cells belonging to the corresponding row, and a plurality of bit lines provided corresponding to said plurality of columns and each connected to the memory cells belonging to the corresponding column, each of said first and second memory arrays is divided with predetermined spacings into a plurality of blocks so as to divide each of said plurality of word lines at a plurality of points, and which further comprises a plurality of low resistance lines provided above said plurality of word lines in parallel thereto, each of said plurality of low resistance lines being connected to the corresponding word line at said plurality of points.

19. The semiconductor memory device according to claim 18, wherein said interconnections are provided so as to cross said first and second memory arrays in said predetermined spacing region between said plurality of blocks.

20. A semiconductor memory device comprising:

a semiconductor chip, a first memory array provided on said semiconductor chip and formed of predetermined layers, said first memory means includes a first memory array, second memory means provided on said semiconductor chip and formed of predetermined layers, said second memory means includes a second memory array, each of said first and second memory arrays is divided with predetermined spacings into a plurality of blocks so as to divide each of a plurality of word lines at a plurality of points, driving circuit means comprising a peripheral circuit provided on said semiconductor chip for driving said first and second memory means, said first and second memory means being arranged on one and the other sides of said driving circuit means, respectively, one or more pads provided on said semiconductor chip for receiving externally applied signals and predetermined potentials, and interconnecting means, including interconnections formed of a layer other than said predetermined layers, for interconnecting said pads and said driving circuit means, said interconnections being provided so as to cross said first and second memory arrays in said predetermined spacings between said plurality of blocks, whereby no additional chip area is required to form said interconnections.

21. A semiconductor memory device comprising:

a semiconductor substrate having first and second memory array forming regions arranged with a space therebetween and a circuit means forming region located in said space between said first and second memory array forming regions;

a plurality of first memory cells formed in said first memory array forming region of said semiconductor substrate and arranged in a plurality of rows and columns, each including one transistor and one capacitive element;

a plurality of first word lines arranged on said first memory array forming region of said semiconductor substrate, each connected to first memory cells arranged in a corresponding row;

a plurality of first bit lines arranged on said first memory array forming region of said semiconductor substrate, each connected to first memory cells arranged in a corresponding column;

a plurality of second memory cells formed in said second memory array forming region of said semiconductor substrate and arranged in a plurality of rows and columns, each including one transistor and one capacitive element;

a plurality of second word lines arranged on said second memory array forming region of said semiconductor substrate, each connected to second memory cells arranged in a corresponding row;

a plurality of second bit lines arranged on said second memory array forming region of said semiconductor substrate, each connected to second memory cells arranged in a corresponding column;

circuit means formed in said circuit means forming region of said semiconductor substrate;

an interconnection line electrically connected to said circuit means and arranged so as to cross one of said first and second memory array forming regions; and a plurality of first column selecting lines for selecting any of said plurality of first bit lines and a plurality of second column selecting lines for selecting any of said plurality of second bit lines; wherein said first and second memory array forming regions are arranged along the column direction, said circuit means includes first column selecting means receiving a column address signal and for selecting and activating any of said plurality of first column selecting lines and second column selecting means receiving a column address signal and for selecting and activating any of said plurality of second column selecting lines, and said interconnection line electrically connected to said circuit means is arranged between adjacent first or second column selecting lines.

22. The semiconductor memory device according to claim 21, wherein said interconnection line electrically connected to said circuit means is formed of the same material in the same layer as said plurality of first and second column selecting lines.

23. The semiconductor memory device according to claim 21, wherein said plurality of first memory cells formed in said first memory array forming region constitute a plurality of first memory cell blocks divided in the column direction, said plurality of second memory cells formed in said second memory array forming region constitute a plurality of second memory cell blocks divided in the column direction, said plurality of first column selecting lines are arranged so as to cross a plurality of first memory cell blocks, and said plurality of second column selecting lines are arranged so as to cross a plurality of second memory cell blocks.

24. The semiconductor memory device according to claim 23, wherein said interconnection line electrically connected to said circuit means is formed of the same material in the same layer as said plurality of first and second column selecting lines.

25. A semiconductor memory device comprising:

a semiconductor chip, a first memory means provided on said semiconductor chip and formed of predetermined layers;

second memory means provided on said semiconductor chip and formed of predetermined layers;

driving circuit means comprising a peripheral circuit provided on said semiconductor chip for driving said first and second memory means, said first and second memory means being arranged in a common column on one and the other sides of said driving circuit means, respectively;

one or more pads provided on said semiconductor chip for receiving externally applied signals and predetermined potentials, said driving circuit means and the pads are all arranged in said common column; and interconnecting means, including interconnections formed of a layer other than said predetermined layers, for interconnecting said pads and said driving circuit means; wherein said interconnections are provided so as to cross one of said first and second memory means, whereby no additional chip area is required to form said interconnections, said first memory means includes a first memory array, said second memory means includes a second memory array, each of said first and second memory arrays includes a plurality of memory cells arranged in a plurality of columns and in a plurality of rows, a plurality of word lines provided corresponding to said plurality of rows and each connected to the memory cells belonging to the corresponding row, and a plurality of bit lines provided corresponding to said plurality of columns and each connected to the memory cells belonging to the corresponding column, and each of said first and second memory arrays is divided with predetermined spacings into a plurality of blocks so as to divide each of said plurality of word lines at a plurality of points; and further including column selecting lines formed in the same level on said chip as the layer including said interconnections, and a plurality of low resistance lines provided above said plurality of word lines in parallel thereto, each of said plurality of low resistance lines being connected to the corresponding word line at said plurality of points.

26. A semiconductor memory device comprising:

a semiconductor substrate having first and second memory array forming regions arranged with a space therebetween and a circuit means forming region located in said space between said first and second memory array forming regions;

a plurality of first memory cells formed in said first memory array forming region of said semiconductor substrate and arranged in a plurality of rows and columns, each including one transistor and one capacitive element;

a plurality of first word lines arranged on said first memory array forming region of said semiconductor substrate, each connected to first memory cells arranged in a corresponding row;

a plurality of first bit lines arranged on said first memory array forming region of said semiconductor substrate, each connected to first memory cells arranged in a corresponding column;

a plurality of second memory cells formed in said second memory array forming region of said semiconductor substrate and arranged in a plurality of rows and columns, each including one transistor and one capacitive element;

a plurality of second word lines arranged on said second memory array forming region of said semiconductor substrate, each connected to second memory cells arranged in a corresponding row;

a plurality of second bit lines arranged on said second memory array forming region of said semiconductor substrate, each connected to second memory cells arranged in a corresponding column;

circuit means formed in said circuit means forming region of said semiconductor substrate; and an interconnection line electrically connected to said circuit means and arranged so as to cross one of said first and second memory array forming regions; wherein said first and second memory array forming regions of said semiconductor substrate are arranged along the column direction, each of said plurality of first and second word lines has a first layer integrated with the gate electrodes of the transistors in memory cells arranged in a corresponding row and a second layer arranged above and parallel with said first layer with an insulator layer interposed therebetween, said second layer being electrically connected to said first layer at predetermined portions, and said interconnection line electrically connected to said circuit means is arranged so as to pass through connecting locations between first and second layers of said plurality of first or second word lines.

* * * * *